United States Patent

Thompson

[15] 3,665,343

[45] May 23, 1972

[54] VOLTAGE CONTROLLED MULTIVIBRATOR

[72] Inventor: James Elbert Thompson, Scottsdale, Ariz.

[73] Assignee: Motorola, Inc., Franklin Park, Ill.

[22] Filed: Nov. 9, 1970

[21] Appl. No.: 87,909

[52] U.S. Cl. ........................331/113 R, 331/145, 331/177 R

[51] Int. Cl. ........................................................H03k 3/282

[58] Field of Search ..........................331/113 R, 145, 177 R

[56] References Cited

UNITED STATES PATENTS 3,167,726 1/1965 Foerster ........................331/113 R X 3,061,799 10/1962 Biard.............................331/113 R X

*Primary Examiner*—Roy Lake

*Assistant Examiner*—Siegfried H. Grimm

*Attorney*—Mueller and Aichele

[57] ABSTRACT

A voltage controlled multivibrator having an output frequency which is a linear function of a control voltage over the entire operating range of the device is disclosed in which the output frequency is a linear function of the current drawn by the multivibrator circuit. The multivibrator includes a variable current source to regulate its output frequency in which current through the variable current source is a linear function of the control voltage.

5 Claims, 6 Drawing Figures

James E. Thompson

BY Mueller & Aichele

ATTY'S.

INVENTOR
James E. Thompson
BY Mueller & Aichele
ATTY'S.

VOLTAGE CONTROLLED MULTIVIBRATOR

This invention relates to multivibrators and more particularly to a multivibrator whose output frequency is a linear function of a control voltage.

Although voltage controlled multivibrators are well known in the prior art, a problem peculiar to these multivibrators is that the output frequency is not a linear function of the control voltage. The nonlinearity of the multivibrator limits the linear frequency response of the device to a small range and prevents accurate setting of the multivibrator over the entire frequency range of the device.

The subject multivibrator circuit provides for an output which is linear with respect to the control voltage over the entire range of operation of the device. When the subject multivibrator is used as the oscillator in a clocking circuit, clock rates may be varied over a range heretofore unattainable. Applications for this voltage controlled multivibrator include frequency synthesizers, signal conditioning, tracking filters, telemetry decoders, FM IF strips and demodulators, data synchronizers, and phase locked loops.

The subject voltage controlled multivibrator circuit differs from prior circuits in that the control voltage is used to vary the current source for the multivibrator. It will be shown that the output frequency of the multivibrator is directly proportional to the current drawn by selected circuits of the multivibrator and that when these currents are varied as a linear function of a control voltage, the output frequency will be directly proportional to the control voltage.

It is therefore an object of this invention to provide a multivibrator circuit whose output frequency is directly proportional to a control voltage.

It is another object of this invention to provide a multivibrator circuit whose output frequency is linear with respect to the current drawn thereby.

It is a still further object of this invention to provide a voltage controlled multivibrator which has an increased frequency range, whose output frequency is linear with respect to a control voltage over the entire operating range of the device, and which provides a logic level signal.

Other objects of this invention will be better understood upon reading the description of the following drawings.

Figure 1:
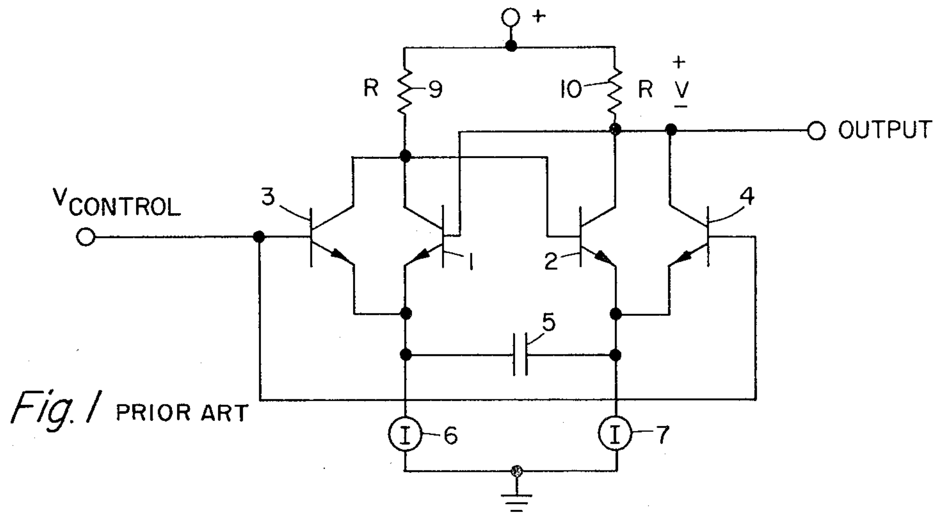
Fig. 1 PRIOR ART
FIG. 1 is a schematic diagram of a prior art voltage controlled multivibrator.
Figure 2:
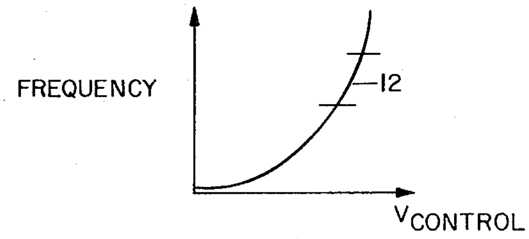
FIG. 2 is a frequency versus control voltage response curve for the multivibrator shown in FIG. 1.

Prior art voltage controlled multivibrators utilize constant current sources and as such differ from the subject system. The output frequency of these prior art devices can be represented as follows: $f=K\ (I/CV)$ where $V=V_{CC}-V_{control}$, and where $I$ is the current drawn by the device, $C$ the capacitance of the capacitor used and ($V_{CC}-V$ control) varies the threshold at which each of the switching transistor elements is rendered conducting or is turned ON. These prior art devices maintain $I$ constant and vary $V$. Thus, in the prior art devices the output frequency is a hyperbolic and not a linear function of the control voltage. The present circuit keeps $V$ constant and varies $I$ to change the output frequency. Thus, the output frequency is a linear function of the current. In order to understand this difference in approach a typical prior art voltage controlled multivibrator is shown in FIG. 1 consisting of switching transistors 1 and 2 and control transistors 3 and 4. The emitters of switching transistors 1 and 2 are coupled across a capacitor 5 and through constant current sources 6 and 7, respectively, to ground. The collector supply voltage, $V_{CC}$, for these transistors is fed through resistors 9 and 10. If transistors 3 and 4 were left out of the circuit, the remaining circuit would oscillate at a frequency determined by capacitor 5 and resistors 9 and 10. It will be assumed in this and the following circuits that the $\beta$ of all transistors are sufficiently large that the effects of base currents can be ignored.

In the prior art voltage controlled multivibrator shown, if transistor 2 is in an OFF condition, the voltage at the emitter of transistor 1 is high. As capacitor 5 is discharged by current flowing towards transistor 2 the voltage on the emitter of transistor 2 is reduced until it reaches $V_{CC}-2IR-\phi$, where $V_{CC}$ is the collector supply voltage, $I$ is the current through either of the current sources, 6 or 7 and $\phi=V_{BE}$ for either transistor 1 or 2. When the voltage on this emitter drops to $V_{CC}-2IR-\phi$, as will occur when a capacitor 5 discharges through constant current source 7, transistor 2 conducts drawing current through resistor 10. This lowers the voltage applied to the base of transistor 1 from a very high initial value to a somewhat lower value. This lowers the voltage at the emitter of transistor 1, and when the voltage drops below that available at the left hand plate of capacitor 5, transistor 1 will be turned OFF, transistor 2 will be turned ON and the capacitor will start charging in the reverse direction, i.e., from right to left. In order to increase the frequency of the multivibrator a control voltage, $V_{control}$, is applied to the bases of transistors 3 and 4. When $V_{control}>V_{CC}-2IR$ then transistor 4 conducts, drawing current through resistor 10. Here $IR$ is the voltage drop across either resistor 9 or 10. This lowers the base of transistor 1 turning it OFF prior to the time that transistor 2 would ordinarily do so. Another way of explaining the operation of this circuit is to say that the voltage at the right hand side of capacitor 5 need drop only to $V_{control}-\phi$ rather than $V_{CC}-2IR-\phi$ in order to turn transistor 2 ON and transistor 1 OFF. Thus if $V_{control} > V_{CC}-2IR$ then transistor 2 will be turned ON sooner than if $V_{control}$ were not applied.

In prior art multivibrators the output frequency increase is not linear with respect to the control voltage, but is rather a hyperbolic function. The circuit, according to the present invention, keeps the voltage drop across the load resistors constant while varying the current flow through the capacitor to change the frequency as a linear function of the current. The current is then made to be a linear function of a control voltage. In the past, attempts have been made to operate the voltage controlled multivibrator over only a small portion of the hyperbolic frequency versus control voltage curve in order to obtain linearity. This however limits the frequency range of the multivibrator. It will be appreciated that in the prior art multivibrator a constant current source is used. Until the present invention it was not recognized that the output of a multivibrator could be made proportional to the current drawn through it and that there was a way of controlling this current linearly with respect to a control voltage.

Figure 3:
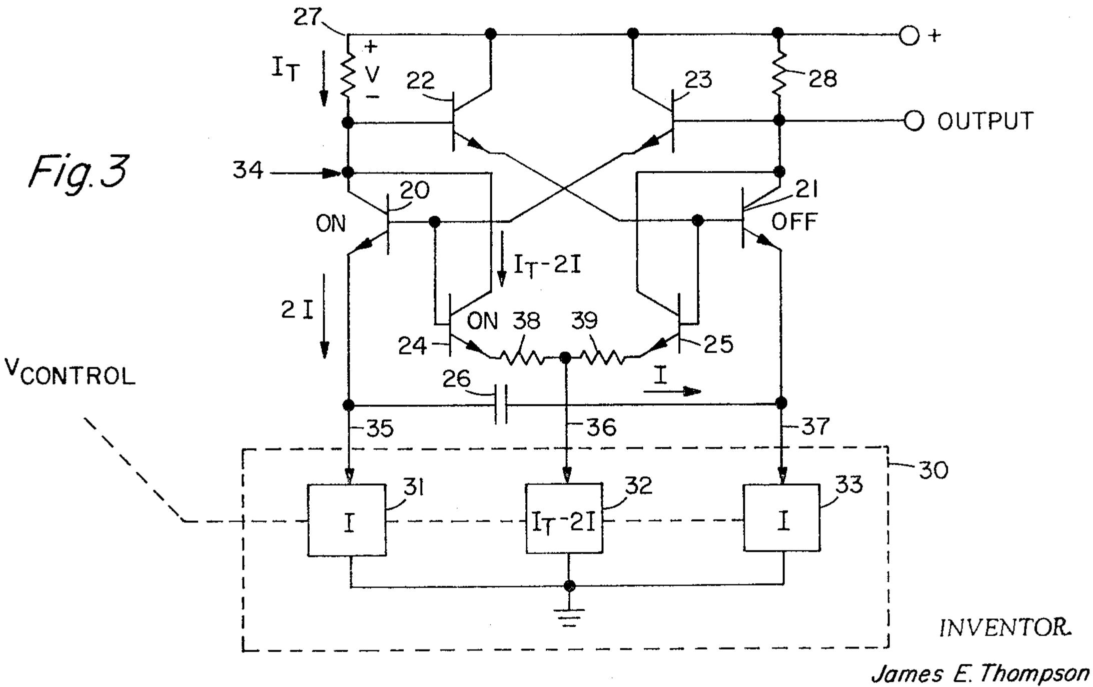
FIG. 3 is a schematic diagram of a multivibrator whose output is linear with respect to the control voltage.

A multivibrator utilizing the current control concept is shown in FIG. 3 consisting of switching transistors 20 and 21, level shifting transistors 22 and 23 and current steering transistors 24 and 25.

These current steering transistors are utilized so that all the current drawn by the multivibrator will be directed through first one and then the other of load resistors 27 and 28. The frequency of the multivibrator output will be shown to be $f=I/[4C\ (I_TR)]$. $I_TR$ will be shown to be the constant voltage drop across the load resistors, the frequency being varied by varying $I$, which is the current in the conducting leg of the multivibrator. These current steering transistors will also be shown to ensure that all of the current is being drawn through first one load resistor and then the other corresponding to which leg of the multivibrator is conducting. Thus frequency control is accomplished, not by controlling the threshold voltage at the switching transistors, but rather by controlling the charging current through the capacitor. This current can be controlled by variable current sources external to the multivibrator as will be described hereinafter.

First it is important to see that the current through first one and then the other of load resistors 27 and 28 always equals $I_T$, the total current drawn by the multivibrator. Then it will be seen that the voltage drop across these resistors will be constant and that the output frequency will be a linear function of current in the conducting leg.

As in the prior art, the emitters of the switching transistors are connected across a capacitor 26 having a capacitance *C*. The emitters of switching transistors 20 and 21 and current steering transistors 24 and 25 are connected to current sources which function together as a current control circuit. These sources are shown in dotted box 30 and control the currents drawn from these emitters to ground. The currents drawn through each of the legs 35, 36 and 37 of this circuit are designated $I$, $I_T-2I$, and $I$, and are shown in boxes 31, 32 and 33 respectively. $I_T$ is the total current drawn by the multivibrator and $I$ is the current in each of legs 35 and 37. It will be shown that $I/I_T$ can be altered as a linear function of the control voltage. Thus, linear voltage control of the current source is possible to achieve linear frequency control.

Figure 4:
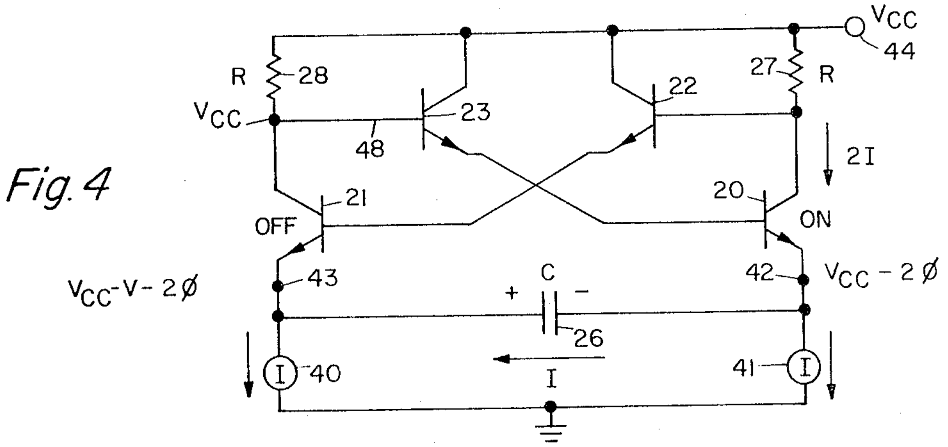
FIG. 4 is a schematic diagram of a portion of the multivibrator shown in FIG. 3.

Before discussing the function of the elements of the circuits shown in FIG. 3, a simplified schematic diagram of the multivibrator without the controlled current source and current steering transistors 24 and 25 is shown. Like elements in FIG. 4 are labelled with like numerals to correspond to those elements which are identical in FIG. 3.

Figure 6:
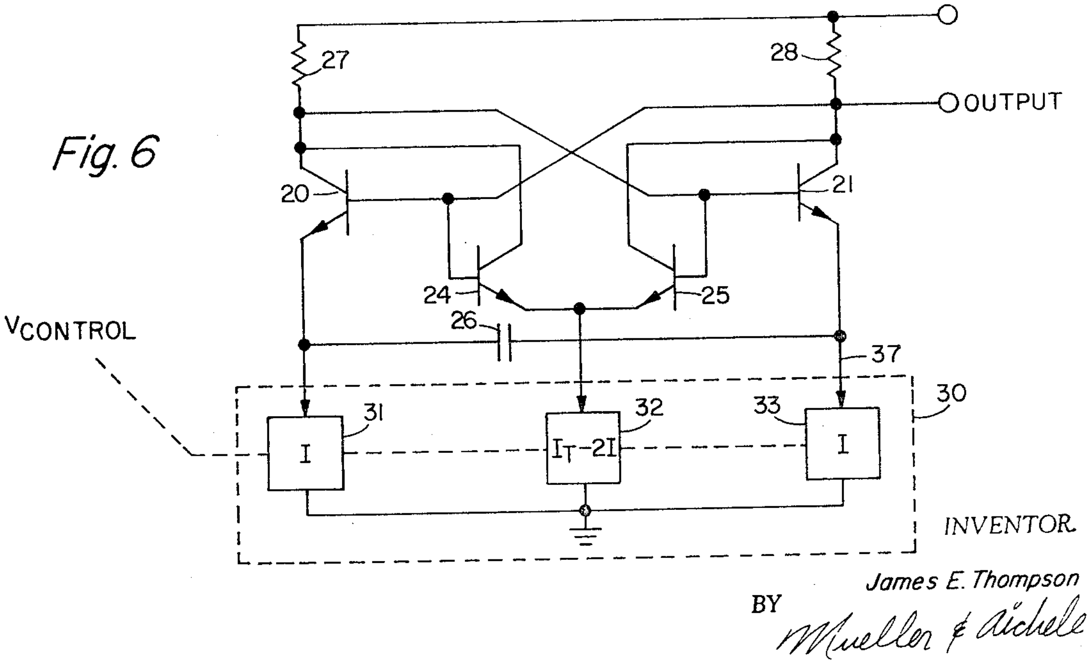
FIG. 6 is a schematic diagram of the multivibrator shown in FIG. 3 without the level shifting transistor elements.

At one point in time switching transistor 20 will be conducting and is said to be ON. At this time switching transistor 21 will be OFF and not conducting. Also, at this point in time current will be flowing through capacitor 26 in the direction shown by the arrow. The current flowing through switching transistor 20 will be $2I$, that is to say, the current flowing through current source 41 and current source 40. As in the multivibrator shown in FIG. 1, the voltage at point 43, which is initially high, finally drops to a level $V_{CC}-V-2\phi$. This is due to the discharge of capacitor 26 through current source 40. The starting polarity of this capacitor is as shown. $V$, in this expression, is the voltage drop across resistor 27 when switching transistor 20 is conducting. At this time resistor 28 is conducting no current and $V_{CC}$ therefore appears at point 48, to keep switching transistor 20 ON. $\phi$ is an alternate expression for $V_{BE}$, the base to emitter voltage drop. The expression $2I$ expresses the fact that $2I$ current is flowing through switching transistor 20. When point 43 drops to $V_{CC}-V-2\phi$, switching transistor 21 conducts drawing current through resistor 28. This reduces the base voltage to level shifting transistor 23 reducing its emitter voltage. This in turn reduces the voltage to the base of switching transistor 20, which in turn reduces the emitter voltage of this transistor, and further reduces the voltage at the emitter of switching transistor 21. This in turn draws more current through resistor 28 which in turn again lowers the base voltage of level shifting transistor 23 and the voltage at the base of switching transistor 20. Eventually the voltage at the base of switching transistor 20 will be below that necessary to sustain conduction and switching transistor 20 will then be in an OFF condition. It will be appreciated that level shifting transistors 22 and 23 are not necessary circuit elements and that the collector of switching transistor 20 could be connected directly to the base of switching transistor 21 and vice versa as shown in FIG. 6 in which corresponding elements in FIGS. 3, 4 and 6 have like numbers. Initially when switching transistor 20 is ON, the voltage at the emitter is $V_{CC}-2\phi$ as shown at point 42, and it is this voltage which is necessary to turn either switching transistor 20 or 21 ON.

The voltage end to end on the capacitor of this multivibrator is a sawtooth wave having an amplitude $2V$ and a period from peak to peak labelled Y. The current $I$ to the capacitor $$= C\frac{dE}{dt} = C\frac{(2V)}{T/2}.$$

Since the period $T=1/f$, $I$ then $=4CVf$ or $f=I/4CV$. However $V$ in this formula equals $2IR$, therefore the frequency $= I/4C2IR = 1/8RC$. In this formula only the resistance and the capacitance of the network are variables affecting the frequency. However, if we revert back to formula $f=I/4CV$ it will become apparent that the frequency may be varied by keeping $V$ constant and varying the current. $V$ is kept constant as follows: If we consider that the only voltage drop of significance is the voltage drop across either load resistor 27 or 28, then $V$ is kept constant if this voltage drop, $I_TR$, is kept constant. Here $I_T$ is both the total current drawn by the multivibrator and the current through either load resistor 27 or 28, depending on the state of the multivibrator circuit. Then since $f=I/[4C\,(I_TR)]$, by holding $I_T$ constant, $f$ may be varied as a linear function of $I$ which is the current in one leg of the multivibrator. $I_T$ is held constant by the addition of current steering transistors 24 and 25 shown in FIG. 3. The function of the steering transistors is to insure that all the current drawn by the multivibrator is drawn only through either one or the other of load resistors 27 and 28 and that this current is both constant and equal to $I_T$. It will be appreciated that both $I$ and $I_T$ can be simultaneously varied such that the output frequency will be a linear function of both of these variables. However, the simplest way to vary the frequency of the multivibrator is to hold $I_T$ constant and vary $I$.

By way of illustration, the voltage $V$ at, for instance, load resistor 27 is made constant by keeping $I_TR$ across this resistor constant. This is accomplished by adding current steering transistors 24 and 25 to the circuit. When switching transistor 20 is ON, current steering transistor 24 will be conducting and it will conduct a current $I_T-2I$. The 2I portion of this current is drained off through switching transistor 20 and current sources 31 and 33. It will be appreciated that the current at point 34 will thus equal $I_T-2I+2I=I_T$. Thus, with transistor 24 drawing $I_T-2I$, $I_T$ remains constant through resistor 27 and $I_TR$ remains constant no matter what variations are given to $I$. From the formula $f=I/[4C\,(I_TR)]$ it can be seen that $f$ is directly proportional to $I$.

The $I_T-2I$ current drawn through current steering transistors 24 and 25 which form a differential pair is also drawn through resistors 38 and 39 coupled in series between the emitters of the differential pair as shown in FIG. 3. It is important that when switching transistor 20 is ON, current steering transistor 24 is also ON; and likewise for transistors 21 and 25, so that the $I_T-2I$ current can be drawn exclusively through either load resistor 27 and 28 to keep their voltage drop constant. Without resistors 38 and 39 the transition width of this differential pair would be too narrow to permit simultaneous conduction of transistors 20 and 24 or transistors 21 and 25. Thus, the $I_T-2I$ current would not be drawn by only load resistor 27 or 28 and the voltage drop across these resistors would not be constant resulting in nonlinearity. The addition of load resistors 38 and 39 broadens the transition width to enable each of the differential pair to follow closely its respective switching transistor, i.e., to be responsive to the relatively small changes in voltage at the base of its corresponding switching transistor.

Figure 5:
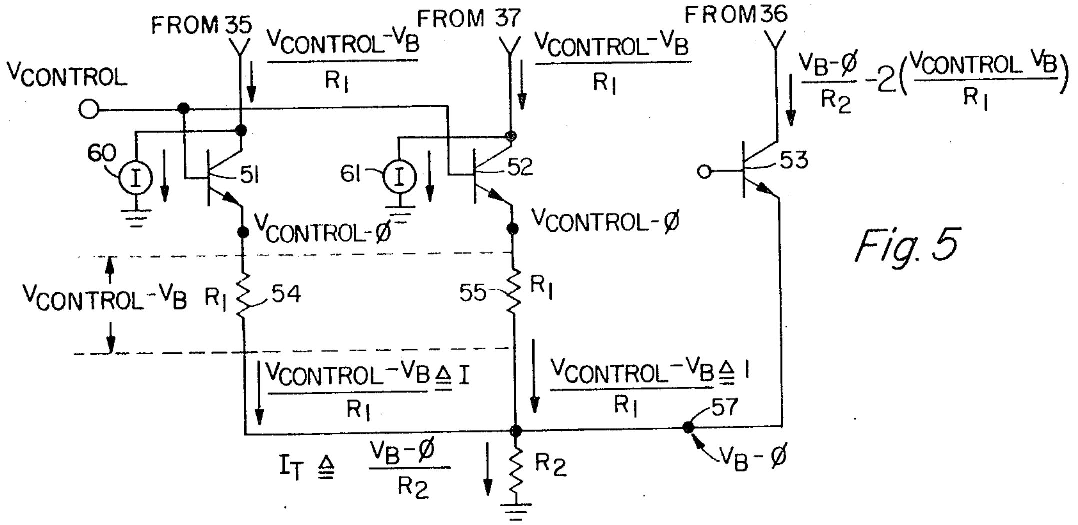
FIG. 5 is a schematic diagram of the voltage controlled current source shown enclosed in the dotted box in FIG. 3.

The only problem remains in drawing the appropriate currents in legs 35, 36 and 37 respectively. One possible circuit which can act as a variable current source with the voltage controlled multivibrator circuit shown in FIG. 3 is shown in FIG. 5. It is composed of three transistors 51, 52 and 53 coupled to legs 35, 37 and 36 shown in FIG. 3. Control of the current through transistors 51 and 52 is accomplished by applying a base control voltage labelled $V_{control}$. The emitters of these two transistors are coupled to resistors labelled $R_1$ at 54 and 55. The path to ground for these resistors and for the emitter of transistor 53 is supplied by resistor $R_2$ labelled 56. It will be shown that if the current, $I$, defined to be that through transistors 51 or 52, is varied, that the current through transistor 53 will be, $I_T-2I$ which satisfies the conditions for a linear frequency response of the multivibrator.

Considering transistor 53 with a fixed bias on its base, labelled $V_B$, it will be noted that at point 57 the voltage will be $V_B-\phi$ in which $\phi$ is $V_{BE}$, the base to emitter voltage drop for transistor 53. The total current $I_T$ is therefore defined to be $(V_B-\phi)/R_2$, and is kept constant. Referring to either transistor 51 or 52, it will be appreciated that the emitter voltage will equal ($V_{control} - \phi$) where $\phi$ again is the base to emitter voltage drop of these transistors. The voltage drop across either resistor 54 or 55 is therefore $V_{control} - \phi - (V_B - \phi) = V_{control} - V_B$. The current through $R_1$, is therefore $(V_{control} - V_B)/R_1$. It is this current which flows in leg 35 or 37 and is defined to be $I$. The current flowing through transistor 53 will therefore be the total current minus the current flowing through the other legs of the multivibrator. The current flowing through transistor 53 is therefore $$= \frac{V_B - \phi}{R_2} - 2\frac{(V_{\text{control}} - V_B)}{R_1}.$$

However, by definition, $$\frac{V_B - \phi}{R_2} = I_T \text{ and } \frac{(V_{\text{control}} - V_B)}{R_1} = I.$$

Therefore the current flowing through transistor $53 = I_T - 2I$, satisfying the condition for the third leg of the multivibrator shown in FIG. 3. It will be appreciated that for a linear variation in $V_{control}$, a linear variation in $I$ will result. Thus, the frequency output of the multivibrator will be linear with respect to changes in the control voltage. If $V_{control}$ drops to 0 volts there will be no current through transistors 51 and 52, which results in shutting down of the multivibrator. This shutdown can be prevented either by limiting the level to which $V_{control}$ can drop or by providing minimum constant current sources shown at 60 and 61.

When the above current relationships are met in the three legs of the multivibrator shown in FIG. 3, and output frequency proportional to the current and therefore proportional to the control voltage is obtained.

What is claimed is:

1. A multivibrator having an output frequency directly proportional to a control voltage in which said output frequency changes linearly in response to current changes therethrough comprising:

a potential voltage source;

a pair of resistors coupled at one end thereof to said source;

a pair of level shifting transistors having collectors coupled to said source and bases coupled to different ones of said resistors at ends opposite to those coupled to said source;

a pair of switching transistors having collectors coupled to said opposite ends of different ones of said resistors, having bases coupled to emitters of different level shifting transistors, the emitter of one of said level shifting transistors being coupled to the base of that switching transistor whose collector is coupled to the other of said level shifting transistors;

a pair of current steering transistors having collectors and bases coupled to the collectors and bases of different switching transistors such that each switching transistor has a corresponding current steering transistor connected in parallel with it, and the current switching transistors having their emitters interconnected;

a capacitor coupled across the emitters of said switching transistors; and means for coupling the emitters of said switching transistors and the interconnected emitters of said current steering transistors to a reference potential, said means including means for varying the current through said transistors as a linear function of said control voltage such that the current alternately through each of said switching transistors is $2I$ whenever that switching transistor is conducting and the current alternately through each of said current steering transistors is equal to the total current drawn by the multivibrator minus $2I$, said total current being constant, whereby the output frequency of said multivibrator is a linear function of said control voltage.

2. A multivibrator having input means for receiving a control voltage, for providing an alternating voltage output of a frequency that is directly proportional to the magnitude of the control voltage, comprising:

variable current means, responsive to the control voltage, for setting the magnitude of a variable current therethrough representative of the control voltage;

a first and a second load path, equal to each other in electrical impedance, connected in parallel to a voltage source;

first switching means, operatively connected to alternately cause a first current to flow in the first load path, and electrically connected to the variable current means;

second switching means operatively connected to cause a second current, equal in magnitude to the first current, to flow in the second load path alternately with the first current, and electrically connected to the variable current means;

first current steering means, electrically connected to the first switching means, for providing a path for current of a magnitude determined by the difference of the first current and the variable current;

second current steering means, electrically connected to the second switching means for providing a path for current of a magnitude determined by the difference between the second current and the variable current;

bilateral timing means, responsive to the variable current, electrically connected to the first and second switching means to alternately cause the first switching means to operate while disabling the second switching means and then to cause the second switching means to operate while disabling the first switching means in a time period dependent upon the amplitude of the variable current; and output means, responsive to the first and second switching means to provide the alternating voltage output.

3. The multivibrator of claim 2 wherein the first and second switching means each comprise a transistor, the first and second current steering means each comprise a transistor and the timing means comprise a capacitor whose charge rate is dependent upon the amplitude of the variable current.

4. The multivibrator of claim 3 wherein the variable current means further comprise:

a first transistor whose base is connected to the input means, electrically connected to the first switching means;

a second transistor whose base is connected to the input means, electrically connected to the second switching means; and a third transistor electrically connected to the first and second current steering transistors.

5. The invention as recited in claim 4 wherein the emitters of said current steering transistors are interconnected by a pair of series connected resistors.

* * * * *